(12) United States Patent
Strode

(10) Patent No.: US 8,508,398 B1
(45) Date of Patent: Aug. 13, 2013

(54) SYSTEMS FOR COMPARATOR OFFSET CANCELLATION IN SUCCESSIVE-APPROXIMATION-REGISTER ANALOG-TO-DIGITAL CONVERTERS

(75) Inventor: Jonathan Ronald Francis Strode, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 55 days.

(21) Appl. No.: 13/234,541

(22) Filed: Sep. 16, 2011

(51) Int. Cl.
*H03M 1/38* (2006.01)

(52) U.S. Cl.
USPC .......................................... 341/161; 341/155

(58) Field of Classification Search
USPC .................................. 341/155, 163, 144, 161
See application file for complete search history.

(56) References Cited

U.S. PATENT DOCUMENTS

| | | | |
|---|---|---|---|
| 5,426,431 A * | 6/1995 | Ryu | 341/158 |
| 7,432,844 B2 * | 10/2008 | Mueck et al. | 341/163 |
| 8,004,447 B2 * | 8/2011 | Hsu | 341/161 |
| 8,031,099 B2 * | 10/2011 | Zhao et al. | 341/150 |
| 2012/0274489 A1 * | 11/2012 | Chang et al. | 341/110 |

* cited by examiner

*Primary Examiner* — Brian Young

(57) ABSTRACT

A system for a successive-approximation-register analog-to-digital-converter (SAR ADC) includes a first capacitive digital-to-analog converter (DAC), first and second conversion control modules, and an SAR control module. The first capacitive DAC has a size less than a second DAC of the SAR ADC. The first conversion control module generates first and second signals for a comparator of the SAR ADC based on outputs of the first and second capacitive DACs and an analog input signal. The second conversion control module generates third and fourth signals for the SAR control module of the SAR ADC based on outputs of the comparator. The SAR control is configured to (i) control the first and second conversion control modules during a full conversion and a following partial conversion, (ii) determine an offset of the comparator, and (iii) control the SAR ADC based on the determined comparator offset.

20 Claims, 6 Drawing Sheets

SYSTEMS FOR COMPARATOR OFFSET CANCELLATION IN SUCCESSIVE-APPROXIMATION-REGISTER ANALOG-TO-DIGITAL CONVERTERS

FIELD

The present disclosure relates to analog-to-digital converters, and more particularly to systems for comparator offset cancellation in successive-approximation-register analog-to-digital converters (SAR ADCs).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIGS. 1A and 1B, a successive-approximation-register analog-to-digital converter (SAR ADC) 100 is shown. In FIG. 1A, the SAR ADC 100 includes a sample-and-hold circuit (S/H) 102, SAR logic 104, a digital-to-analog (DAC) converter 106, and a comparator 108. The S/H circuit 102 receives an analog input signal to be converted and outputs an input voltage $V_{IN}$ to the comparator 108.

The SAR logic 104 includes an N-bit register to implement a binary search algorithm to convert the analog input signal. The N-bit register is initially set to a midscale value, for example, to 100 . . . 00, where the most significant bit (MSB) is set to 1. The SAR logic 104 outputs the midscale value stored in the N-bit register to the DAC 106. The DAC 106 converts the N-bit input received from the SAR logic 104 and outputs a voltage $V_{DAC}$ to the comparator 108. Since the N-bit input is 100 . . . 00, $V_{DAC}=V_{REF}/2$, where $V_{REF}$ is the reference voltage provided to the SAR ADC 100.

The comparator 108 compares $V_{IN}$ to $V_{DAC}$ and determines if $V_{IN}$ is less than $V_{DAC}$ or greater than $V_{DAC}$. If $V_{IN}$ is greater than $V_{DAC}$, the output of the comparator 108 is a logic high, or 1, and the MSB of the N-bit register remains at 1. Conversely, if $V_{IN}$ is less than $V_{DAC}$, the output of the comparator 108 is a logic low, or 0, and the MSB of the N-bit register is cleared to logic 0. This step is generally referred to as MSB testing.

The SAR logic 104 then moves to the next bit and forces that bit high. The comparator 108 performs another comparison. The process continues to the least significant bit (LSB), which concludes the conversion process. When the conversion is complete, an N-bit digital word is output from the N-bit register. The N-bit word is a digital representation of the analog input. This process of converting an analog signal using the SAR logic 104, the DAC 106, and the comparator 108 is called the binary search algorithm.

In FIG. 1B, an example of a 4-bit conversion using the binary search algorithm is shown (i.e., N=4). In the example, the DAC 106 initially receives $1000_2$ from a 4-bit register in the SAR logic 104. That is, bit 3, the MSB, of the 4-bit register is set to 1. A first comparison shows, for example, that $V_{IN}<V_{DAC}$. Therefore, bit 3 of the 4-bit register is reset to 0. The DAC 106 then receives $0100_2$, and a second comparison is performed. If $V_{IN}>V_{DAC}$, for example, bit 2 of the 4-bit register remains at 1. The DAC 106 then receives $0110_2$, and a third comparison is performed. Bit 1 is reset to 0 if $V_{IN}<V_{DAC}$, for example, and the DAC 106 then receives $0101_2$ for a final comparison. Finally, bit 0 remains at 1 if, for example, $V_{IN}>V_{DAC}$. Thus, a 4-bit word 0101 is output from the 4-bit register, which is a digital representation of the analog input.

The S/H circuit 102 shown in FIG. 1A can be embedded in the DAC 106. Many SAR ADCs use a capacitive DAC that provides an inherent S/H function. A capacitive DAC includes an array of N capacitors with binary-weighted values and one dummy LSB capacitor.

Referring now to FIG. 2, an example of a 16-bit capacitive DAC 200 connected to a comparator 202 is shown. The DAC 200 includes an array of capacitors having binary weighted values. One end of each capacitor is connected to a common terminal. The other end of each capacitor is connected to a switch. The switch connected to each capacitor, except the dummy capacitor, connects the capacitor to an analog input signal ($V_{IN}$), a reference voltage ($V_{REF}$), or ground (GND) depending on control signals received from the SAR logic 104 shown in FIG. 1. The switch connected to the dummy capacitor connects the dummy capacitor to $V_{IN}$ or ground. A switch selectively connects the common terminal to ground. The common terminal is connected to a first input of the comparator 202. A second input of the comparator 202 is connected to ground.

During an acquisition phase, the common terminal of the capacitors is connected to ground, and the other terminals of the capacitors are connected to the analog input signal ($V_{IN}$). After acquisition, the common terminal is disconnected from ground, and the other terminals of the capacitors are disconnected from $V_{IN}$. Effectively, a charge proportional to the input voltage is trapped on the capacitors. The other terminals of the capacitors are then connected to ground, driving the common terminal negative to a voltage equal to $-V_{IN}$.

As a first step in the binary search algorithm, a bottom plate of the MSB capacitor is disconnected from ground and connected to $V_{REF}$. This drives the common terminal in the positive direction by an amount equal to $½V_{REF}$. Therefore, $V_{COMMON}=-V_{IN}+½×V_{REF}$. The output of the comparator 202 is logic 1 if $V_{COMMON}<0$ (i.e., $V_{IN}>½×V_{REF}$). The output of the comparator 202 is logic 0 if $V_{IN}<½×V_{REF}$. If the comparator output is logic 1, then the bottom plate of the MSB capacitor stays connected to $V_{REF}$. Otherwise the bottom plate of the MSB capacitor is connected back to ground. The bottom plate of the next smaller capacitor is then connected to $V_{REF}$, and a new $V_{COMMON}$ voltage is compared to ground. This process continues until all the bits have been determined. In general, $V_{COMMON}=-V_{IN}+(B_{N-1}×V_{REF}/2)+(B_{N-2}×V_{REF}/4)+(B_{N-1}×V_{REF}/8)+ \ldots +(B0×V_{REF}/2^{N-1}$ (B_comparator output/ADC output bits)).

SUMMARY

A system for a successive-approximation-register analog-to-digital-converter (SAR ADC) includes a first capacitive digital-to-analog converter (DAC), first and second conversion control modules, and an SAR control module. The first capacitive DAC has a size less than a second DAC of the SAR ADC, and each of the first and second capacitive DACs receives a value and a reference value. The first conversion control module generates first and second signals for a comparator of the SAR ADC based on outputs of the first and second capacitive DACs and an analog input signal. The second conversion control module generates third and fourth signals for an SAR control module of the SAR ADC based on outputs of the comparator. The SAR control is configured to (i) control the first and second conversion control modules during a full conversion and a partial conversion, the full conversion preceding the partial conversion, (ii) determine an offset of the comparator based on the third and fourth signals received from the second conversion control module during each of the full and partial conversions, and (iii) control the SAR ADC based on the determined comparator offset.

A successive-approximation-register analog-to-digital converter (SAR ADC) includes an N-bit capacitive digital-to-analog converter (DAC), an M-bit capacitive DAC, first and second conversion control systems, a comparator, and an SAR control module. The N-bit capacitive digital-to-analog converter (DAC) generates first and second analog signals based on a value and a reference value. The M-bit capacitive DAC generates third and fourth analog signals based on the value and the reference value. The first conversion control system generates first and second comparator signals based on the first, second, third, and fourth analog signals, and an analog input signal. The comparator generates first and second comparison signals based on the first and second comparator signals. The second conversion control system generates first and second conversion signals based on the first and second comparator signals. The SAR control module (i) receives the first and second conversion signals, (ii) controls the first and second conversion control systems during both a full N-bit conversion and a following partial M-bit conversion to determine an offset of the comparator based on the first and second conversion signals received during each of the full N-bit conversion and the partial M-bit conversion, and (iii) controls future conversions of the SAR ADC based on the determined comparator offset.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Successive-approximation-register analog-to-digital converters (SAR ADCs) may have an inherent offset. The offset may cause problems while operating an SAR ADC. Offset cancellation systems may be implemented in an SAR ADC to remove offset. For example, the SAR ADC 100 of FIG. 1A may have an offset generated by the comparator 108 (comparator offset). The comparator offset, however, may vary based on a plurality of parameters such as time, temperature, voltage, etc. The offset cancellation system, therefore, may have to be capable of removing a variable comparator offset and thus may have to run more than one time.

Figure 3:
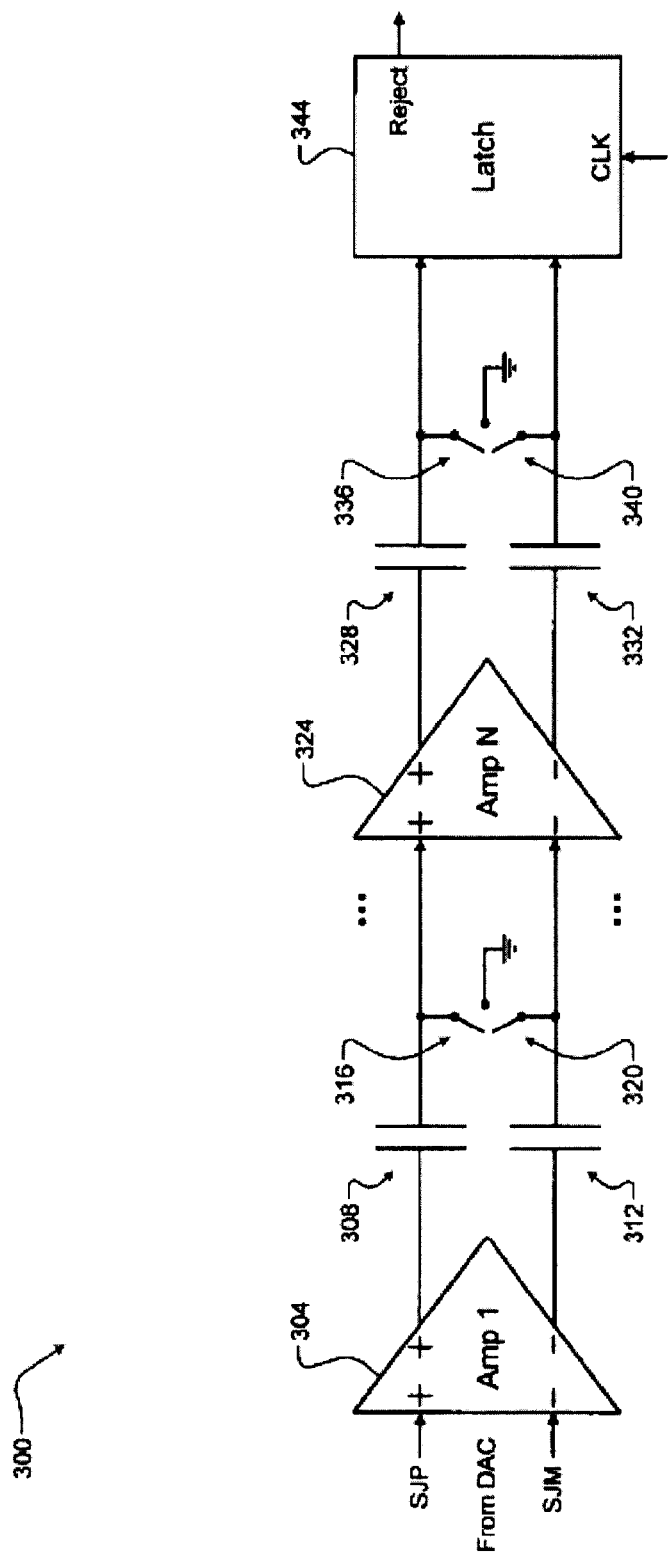
FIG. 3 is a circuit diagram illustrating an example comparator offset cancellation system.

Referring now to FIG. 3, an example offset cancellation system 300 is shown. The offset cancellation system 300 generally includes a plurality of stages of amplifiers (N, N≧2), each of the amplifiers having a pair of offset storage capacitors. More specifically, the offset cancellation system 300 may include a first amplifier 304 (Amp 1) having first ends of offset storage capacitors 308 and 312 connects to its outputs. The first amplifier 304 receives first and second input values from a digital-to-analog converter (DAC) of an SAR ADC. Switches 316 and 320 selectively connect second ends of offset storage capacitors 308 and 312, respectively, to ground.

The second ends of storage capacitors 308 and 312 are also connected to a next stage of the offset cancellation system 300 (in this case, amplifier 324, or Amp N). In other words, for purposes of simplicity, only the first and final stages are shown. Amplifier 324 has first ends of offset storage capacitors 328 and 332 connected to its outputs. Switches 336 and 340 selectively connect second ends of offset storage capacitors 328 and 332, respectively, to ground. The second ends of storage capacitors 328 and 332 are also connected to a latch 344, which operates based on an input clock signal (CLK).

This offset cancellation system 300, however, requires an auto-zero phase. More specifically, the offset cancellation system 300 requires an on/off cycle to capture and store the offset in the offset storage capacitors. Auto-zero phases require additional power and therefore prevent zero power tracking (only powering the SAR ADC on when conversion is occurring). In addition, the offset storage capacitors 308, 312, 328, and 332 of the offset cancellation system 300 may store noise in addition to the respective comparator offsets, which decreases signal-to-noise ratio (SNR) at an output of the SAR ADC. Furthermore, the multiple stages of the offset cancellation system 300 increases a period to remove the comparator offset (i.e., two or more full conversion cycles).

Accordingly, systems are presented for improved comparator offset cancellation in an SAR ADC. The systems provide for faster comparator offset cancellation in addition to increased SNR at an output of the SAR ADC. The systems also do not require an auto-zero phase and therefore provide for zero power tracking (decreased power). The SAR ADC may be an N-bit SAR ADC (N>1) and therefore may include an N-bit register. The SAR ADC may further include a first (main) capacitive DAC module, a comparator module, and an SAR control module. The SAR ADC may further include a comparator offset cancellation system, which may include a second capacitive DAC module, a first conversion control module that controls input to the comparator module, and a second conversion control module that controls input to the SAR control module. The SAR control module may control the various components of the SAR ADC to control the conversion process.

In the case of comparator offset determination/cancellation, the SAR control module controls the SAR ADC to perform a full conversion followed by a partial conversion (or re-conversion). Therefore, as previously described, because the SAR ADC is converting during the entire offset determination/cancellation process, the SAR ADC is therefore capable of zero power tracking. The full conversion includes N cycles, whereas the partial conversion includes M cycles (M<N). The first capacitive DAC module may include an N-bit capacitive DAC and the second capacitive DAC module may include an M-bit capacitive DAC.

The first conversion control module controls the signals that are supplied to the comparator module from the first and second capacitive DAC modules. More specifically, the first conversion control module may generate signals for the comparator module based on signals received from the first an second capacitive DAC modules (in addition to an analog input signal). Similarly, the second conversion control module controls the signals that are supplied to the SAR control module from the comparator module. More specifically, the second conversion control module may generate signals for the SAR control module based on signals received from the comparator module. For example only, the first and second conversion control modules may include adders and/or switching elements.

The first and second conversion control modules control the signals supplied to the comparator module and the SAR control module, respectively, during the full conversion such that the SAR control module calculates a difference between the analog input signal and the offset (e.g., $V_{IN}+V_{OFF}$). During the partial conversion, on the other hand, the first and second conversion control modules control the signals supplied to the comparator and the SAR control module, respectively, such that the SAR control module calculates negative two times the offset (e.g., $-2 \times V_{OFF}$). The SAR control module may then scale and then sum the calculations from the full and partial conversions to determine the offset. The SAR control module may then control the future conversions by SAR ADC based on the determined offset. For example only, the SAR control module may compensate for the comparator offset when receiving signals from the comparator module.

Figure 4A:
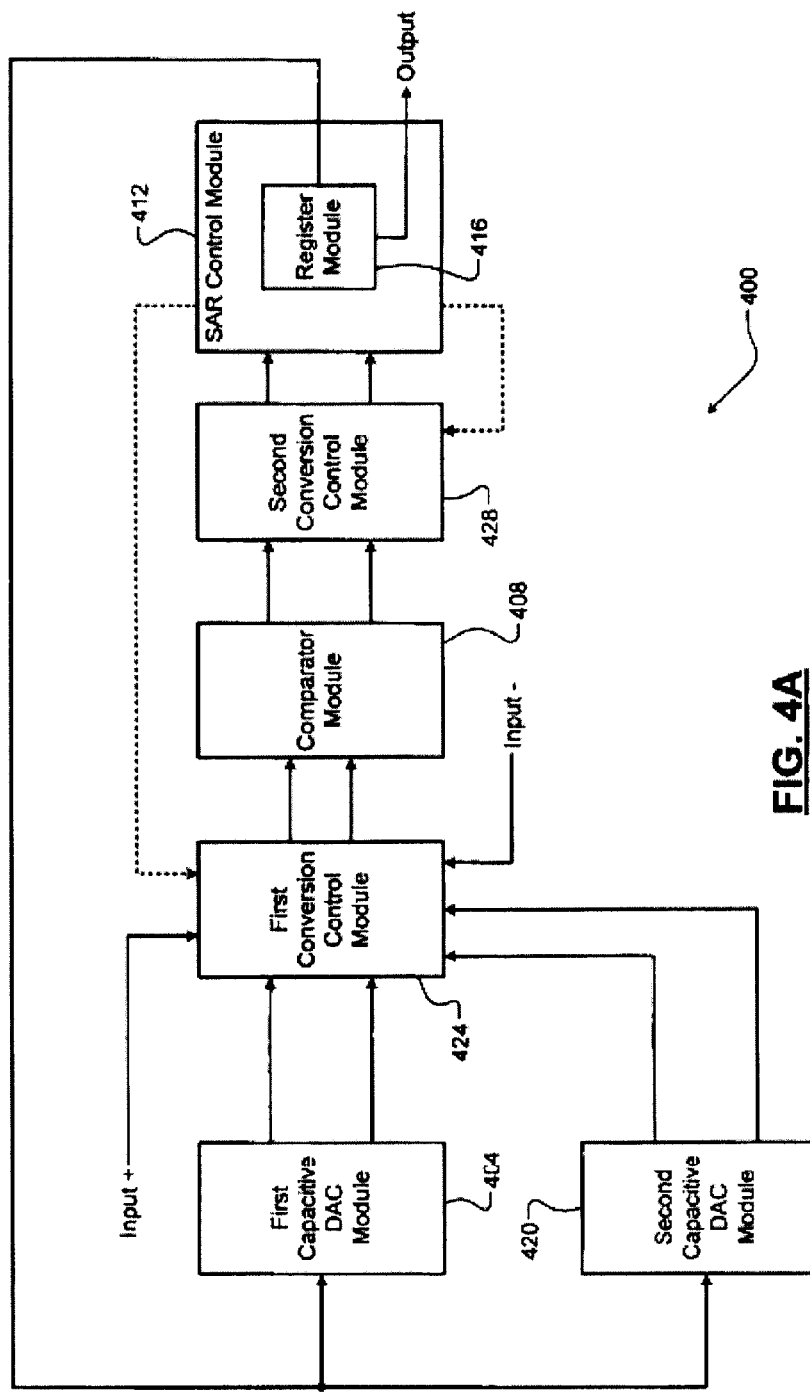
FIG. 4A is a functional block diagram of an SAR ADC including a comparator offset cancellation system according to some implementations of the present disclosure.

Referring now to FIG. 4A, an SAR ADC 400 including an example offset cancellation system is shown. The SAR ADC 400 includes a first capacitive DAC module 404, a comparator module 408, and a SAR control module 412. The SAR control module 412 includes a register module 416. The SAR ADC 400 further includes a second capacitive DAC module 420, a first conversion control module 424, and a second conversion control module 428. The second capacitive DAC module 420, the first conversion control module 424, and the second conversion control module 428 may collectively represent the offset cancellation system.

As previously described, the SAR control module 412 begins a conversion by setting the register module 416. For example, the SAR ADC 400 may be an N-bit SAR ADC (N>1), and therefore the register module 416 may include an N-bit register. The value stored by the register module 416 is output to the first and second capacitive DAC modules 404 and 420, respectively. The value represents a digital (binary) value to be converted to an analog signal for comparison during each cycle of the binary search algorithm. The first and second capacitive DAC modules 404 and 408, respectively, may also each receive a reference value (not shown) to be used in the comparisons.

The first capacitive DAC module 404 may include an N-bit capacitive DAC. Therefore, as previously described, the N-bit capacitive DAC may include N or more weighted capacitors (including a dummy capacitor) and N or more switches, each corresponding to a bit (ranging from a least significant bit, or LSB, to a most significant bit, or MSB). Based on the received value and the reference value, the first capacitive DAC module 404 generates first and second output signals. The first output signal may be an analog representation of the received value and the second output signal may be ground (GND).

The second capacitive DAC module 420 may include an M-bit capacitive DAC (M<N). Therefore, similar to above, the M-bit capacitive DAC may include M or more weighted capacitors (including a dummy capacitor) and M or more switches, each corresponding to a bit (ranging from the LSB to an Mth bit). An LSB of the second capacitive DAC module 420 (the M-bit capacitive DAC), however, may be aligned to an LSB of the first capacitive DAC module 404 (the N-bit capacitive DAC). Similar to above, the second capacitive DAC module 420 generates third and fourth output signals based on the received value and the reference value.

The first conversion control module 424 receives the first, second, third, and fourth output signals. The first conversion control module 424 also receives positive and negative versions of the analog input signal (Input, or $V_{IN}$). The first conversion control module 424 controls which of the received signals (first signals) are supplied to the comparator module 408, and at which input of the comparator module 408. In other words, the first conversion control module 424 may generate comparator signals (for the comparator module 408) based on the first, second, third, and fourth output signals, and the analog input signal $V_{IN}$ (positive and negative versions). The first conversion control module 424, therefore, may include switches and adders for controlling the various input combinations (see, for example, FIG. 4B and below for a specific implementation). The SAR control module 412 may control the first conversion control module 424 differently during the full (N-bit) conversion as compared to during the partial (M-bit) conversion.

The comparator module 408 generates first and second output signals based on a comparison between the received signals. For example, the first signal may be a digital signal (0 or 1) indicating "Keep" and the second signal may be a digital signal indicating "Reject." Additionally, for example only, the comparator module 408 may be a hysteretic comparator 408. As previously described, however, the comparator module 408 may receive different signals as controlled by the first conversion control module 424 (via the SAR control module 412) during the full N-bit conversion and the partial M-bit conversion.

The second conversion control module 428 receives the first and second comparison signals output by the comparator module 408. Similar to the first conversion control module 424, the second conversion control module 428 controls which of the received signals (second signals) are supplied to the SAR control module 412, and at which input. More specifically, the second conversion control module 428 may generate signals for the SAR control module 412 based on the received comparison signals from the comparator module 408. The second conversion control module 428 may include switches for controlling the various input combinations (see, for example, FIG. 4B and below for a specific implementation). Again, the SAR control module 412 may control the second conversion control module 428 differently during the full (N-bit) conversion as compared to during the partial (M-bit) conversion.

As previously described, the SAR control module 412 controls the first and second conversion control modules 424 and 428, respectively, during each of a full N-bit conversion and a partial M-bit conversion. The SAR control module 412 controls the first and second conversion control modules 424 and 428, respectively, to calculate a first value during the full N-bit conversion, the first value including a sum of the analog input voltage ($V_{IN}$) and an offset of the comparator module 408 ($V_{OFF}$), and then to calculate a second value during the partial M-bit conversion, the second value including negative two times the comparator offset ($-2 \times V_{OFF}$). The SAR control module 412 may then scale at least one of the first and second values and sum the first and second values to determine the comparator offset ($V_{OFF}$). The SAR control module 412 may store the determined comparator offset and use the determined comparator offset in controlling future conversion operations.

Figure 4B:
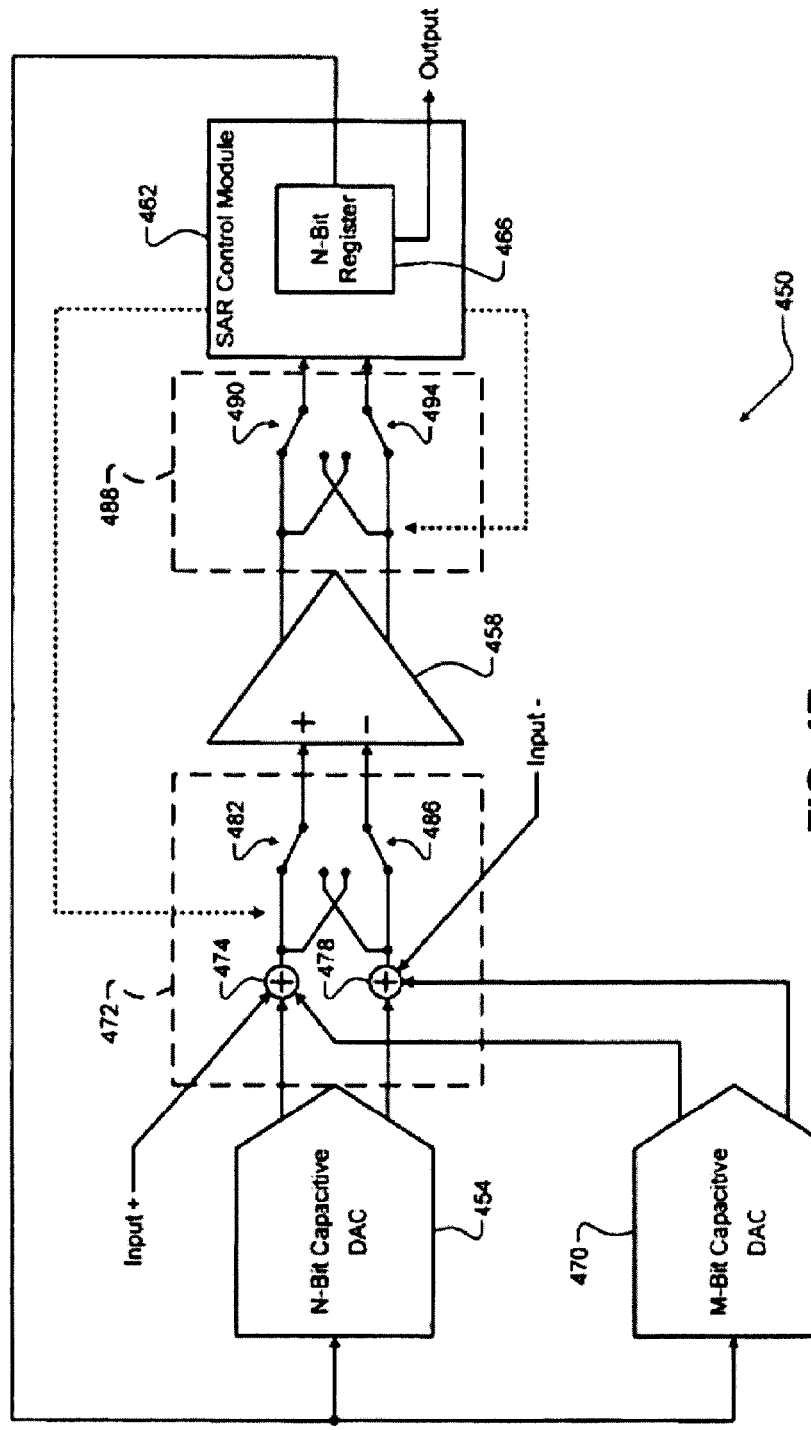
FIG. 4B is a circuit diagram illustrating an SAR ADC including comparator offset cancellation circuitry according to some implementations of the present disclosure.

For example, FIG. 4B illustrates an example circuit diagram for an SAR ADC circuit 450 having specific implementations of both the first and second conversion control modules 424 and 428, respectively, of FIG. 4A. The SAR ADC circuit 450 includes an N-bit capacitive DAC 454 (N>1), a comparator 458, and an SAR control module 462. The SAR control module 462 may include an N-bit register 466. The SAR ADC circuit 450 may further include an M-bit capacitive DAC 470 (M<N), a first conversion control system 472, and a second conversion control system 488. The M-bit capacitive DAC 470 and the first and second conversion control systems 472 and 478, respectively, may collectively represent the offset cancellation circuitry.

The first conversion control system 472 may include first and second adders 474 and 478, respectively, and first and second switches 482 and 486, respectively. For example, the switches 482 and 486 (as well as any other switches herein) may be transistors, such as field effect transistors (FETs). The first adder 474 may sum a first output of the N-bit capacitive DAC 454, a first output of the M-bit capacitive DAC 470, and a positive version of an analog input signal (Input, or $V_{IN}$). Similarly, the second adder 478 may sum a second output of the N-bit capacitive DAC 454, a second output of the M-bit capacitive DAC 470, and a negative version of the analog input signal $V_{IN}$. The first switch 482 may selectively connect the output of the first adder 474 to one of two inputs to the comparator 458. Similarly, the second switch 486 may selectively connect the output of the second adder 478 to one of the two inputs to the comparator 458.

The second conversion control system 488 may include third and fourth switches 490 and 494, respectively. The third switch 490 may selectively connect a first output of the comparator 458 to one of two inputs to the SAR control module 462. Similarly, the fourth switch 494 may selectively connect a second output of the comparator 458 to one of the two inputs to the SAR control module 462. The SAR control module 462 may control the SAR ADC circuit 450 similar to as described above with respect to FIG. 4A. More specifically, the SAR control module 462 may control the switches 482, 486, 490, and 494 during both the full N-bit conversion and the partial M-bit conversion to calculate a first value ($V_{IN}+V_{OFF}$) and a second value ($-2 \times V_{OFF}$), and may then sum the first and second values to determine the comparator offset $V_{OFF}$, which may be used to control future conversions by the SAR ADC circuit. Additionally, for example only, the specific implementation of FIG. 4B may increase the SNR of the conversion by approximately 3 decibels (dB).

Figure 5:
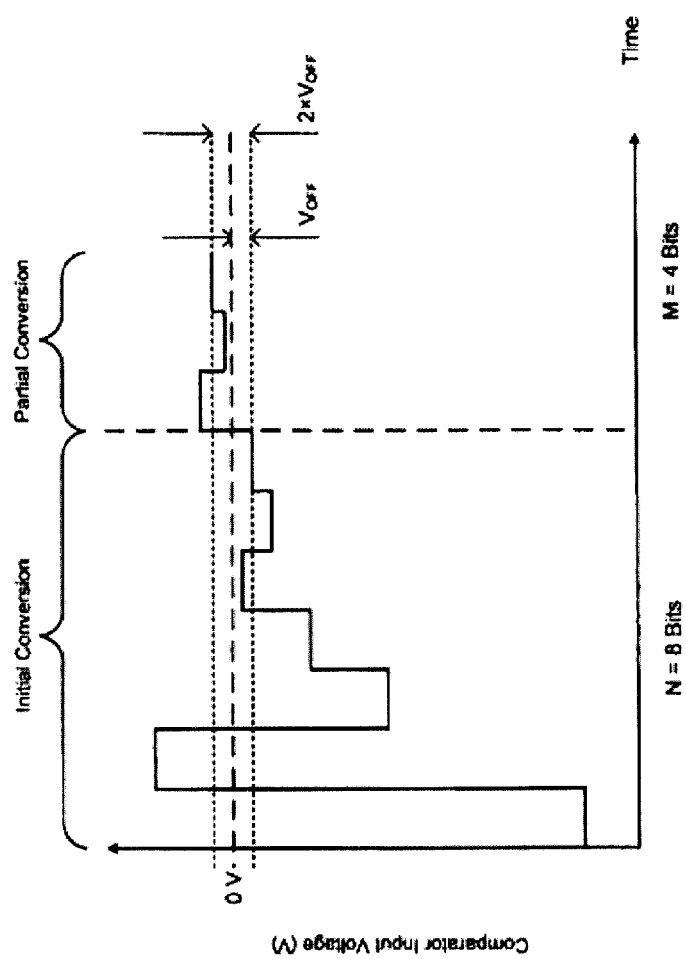
FIG. 5 is a graph illustrating simulated results of an SAR ADC including a comparator offset cancellation system according to some implementations of the present disclosure.

Referring now to FIG. 5, a graph illustrating simulated results of the offset cancellation system/circuitry is shown. As previously described, the offset cancellation system calculates a first value during a full N-bit conversion (here, N=8), the first value including a sum of an analog input voltage ($V_{IN}$) and an offset of a comparator ($V_{OFF}$). Following the full conversion, the offset cancellation system calculates a second value during a partial M-bit conversion (here, M=8), the second value including a negative two times the comparator offset $V_{OFF}$ ($-2 \times V_{OFF}$). The first and second values may then be scaled and summed to determine the comparator offset $V_{OFF}$, which may then be used in controlling future conversions.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

What is claimed is:

1. A system for a successive-approximation-register analog-to-digital-converter (SAR ADC), the system comprising:
   a first capacitive digital-to-analog converter (DAC), the first capacitive DAC having a size less than a second DAC of the SAR ADC, each of the first and second capacitive DACs receiving a value and a reference value, wherein the value received by the first DAC and the second DAC is the same value;
   a first conversion control module that generates first and second signals for a comparator of the SAR ADC based on outputs of the first and second capacitive DACs and an analog input signal;
   a second conversion control module that generates third and fourth signals for an SAR control module of the SAR ADC based on outputs of the comparator; and
   the SAR control module, the SAR control module configured to (i) control the first and second conversion control modules during a full conversion and a partial conversion, the full conversion preceding the partial conversion, (ii) determine an offset of the comparator based on the third and fourth signals received from the second conversion control module during each of the full and partial conversions, and (iii) control the SAR ADC based on the determined comparator offset.

2. A system for a successive-approximation-register analog-to-digital-converter (SAR ADC), the system comprising:
   a first capacitive digital-to-analog converter (DAC), the first capacitive DAC having a size less than a second DAC of the SAR ADC, each of the first and second capacitive DACs receiving a value and a reference value;
   a first conversion control module that generates first and second signals for a comparator of the SAR ADC based on outputs of the first and second capacitive DACs and an analog input signal;

a second conversion control module that generates third and fourth signals for an SAR control module of the SAR ADC based on outputs of the comparator; and the SAR control module, the SAR control module configured to (i) control the first and second conversion control modules during a full conversion and a partial conversion, the full conversion preceding the partial conversion, (ii) determine an offset of the comparator based on the third and fourth signals received from the second conversion control module during each of the full and partial conversions, and (iii) control the SAR ADC based on the determined comparator offset, wherein a least significant bit (LSB) of the first capacitive DAC is aligned to an LSB of the second capacitive DAC.

3. The system of claim 1, wherein the first capacitive DAC is an M-bit capacitive DAC, wherein the second capacitive DAC is an N-bit capacitive DAC, wherein N is an integer greater than one, and wherein M is an integer less than N.

4. The system of claim 3, wherein the full conversion includes N cycles, and wherein the partial conversion includes M cycles.

5. The system of claim 4, wherein the SAR control module controls the first and second conversion control modules during the full conversion to calculate a first value based on the third and fourth signals received from the second conversion control module during the full conversion, the first value including a sum of the analog input signal and the comparator offset.

6. The system of claim 5, wherein the SAR control module controls the first and second conversion control modules during the partial conversion to calculate a second value based on the third and fourth signals received from the second conversion control module during the partial conversion, the second value including negative two times the comparator offset.

7. The system of claim 6, wherein the SAR control module is further configured to scale at least one of the first and second values.

8. The system of claim 7, wherein the SAR control module determines the comparator offset by summing the first and second values.

9. The system of claim 8, wherein the first conversion control module includes at least one of switching elements and adders.

10. The system of claim 9, wherein the second conversion control module includes at least one switching element.

11. A successive-approximation-register analog-to-digital converter (SAR ADC), comprising:
an N-bit capacitive digital-to-analog converter (DAC) that generates first and second analog signals based on an input value and a reference value;
an M-bit capacitive DAC that generates third and fourth analog signals based on the same input value and the reference value;
a first conversion control system that generates first and second comparator signals based on the first, second, third, and fourth analog signals, and an analog input signal;

a comparator that generates first and second comparison signals based on the first and second comparator signals;
a second conversion control system that generates first and second conversion signals based on the first and second comparator signals; and
an SAR control module that (i) receives the first and second conversion signals, (ii) controls the first and second conversion control systems during both a full N-bit conversion and a following partial M-bit conversion to determine an offset of the comparator based on the first and second conversion signals received during each of the full N-bit conversion and the partial M-bit conversion, and (iii) controls future conversions of the SAR ADC based on the determined comparator offset.

12. The SAR ADC of claim 11, wherein the first conversion control system includes first and second adders and first and second switches.

13. The SAR ADC of claim 12, wherein the first adder generates a first sum of the first analog signal, the third analog signal, and a positive version of the analog input signal.

14. The SAR ADC of claim 13, wherein the second adder generates a second sum of the second analog signal, the fourth analog signal, and a negative version of the analog input signal.

15. The SAR ADC of claim 14, wherein the first switch selectively connects an output of the first adder to one of first and second inputs to the comparator, and wherein the second switch selectively connects an output of the second adder to one of the first and second inputs to the comparator.

16. The SAR ADC of claim 15, wherein the second conversion control system includes third and fourth switches, wherein the third switch selectively connects a first output of the comparator to one of first and second inputs to the SAR control module, and wherein the fourth switch selectively connects a second output of the comparator to one of the first and second inputs to the SAR control module.

17. The SAR ADC of claim 16, wherein the SAR control module controls the first, second, third, and fourth switches.

18. The SAR ADC of claim 17, wherein the SAR control module controls the first, second, third, and fourth switches during the full N-bit conversion to calculate a first value that includes a sum of the analog input signal and the comparator offset.

19. The SAR ADC of claim 18, wherein the SAR control module controls the first, second, third, and fourth switches during the following partial M-bit conversion to calculate a second value that includes negative two times the comparator offset.

20. The SAR ADC of claim 19, wherein the SAR control module scales at least one of the first and second values, and sums the first and second values to determine the comparator offset.

* * * * *

UNITED STATES PATENT AND TRADEMARK OFFICE
CERTIFICATE OF CORRECTION

Page 1 of 1

Figure 1A:
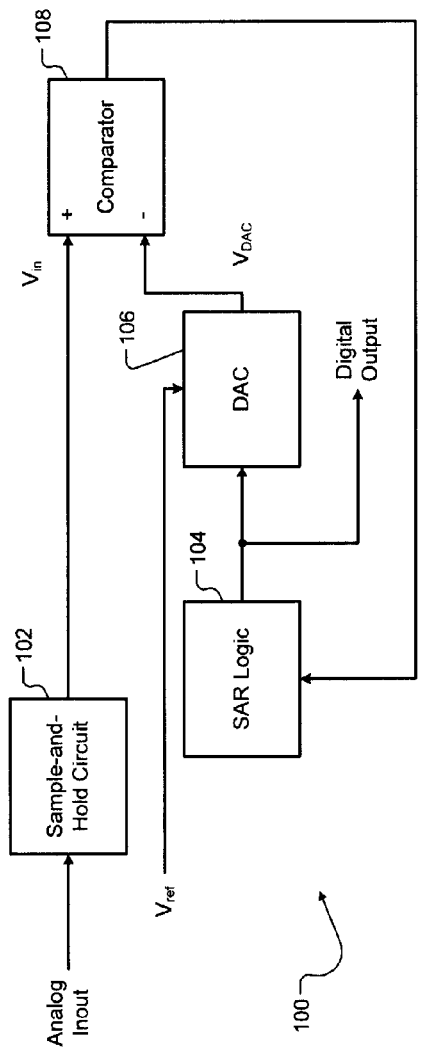
FIG. 1A illustrates a successive-approximation-register analog-to-digital converter (SAR ADC)
Figure 1B:
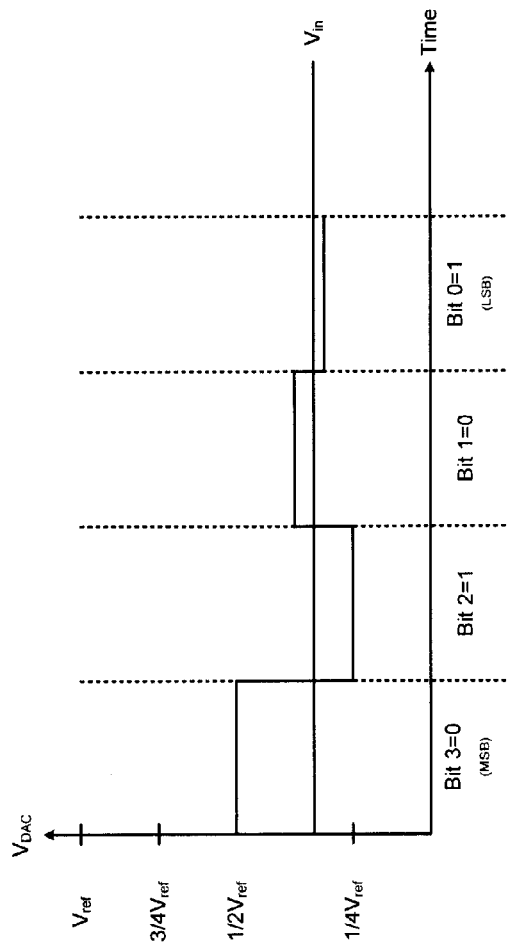
FIG. 1B illustrates an example of a 4-bit conversion performed by a SAR ADC using a binary search algorithm.
Figure 2:
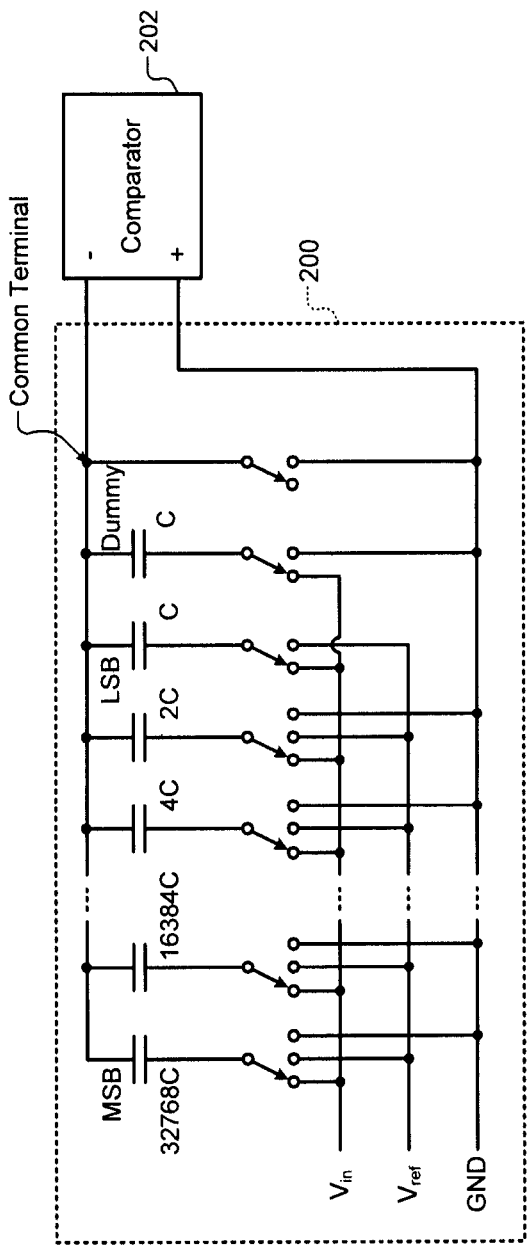
FIG. 2 illustrates an SAR ADC that includes a capacitive digital-to-analog converter (DAC)

PATENT NO.       : 8,508,398 B1
APPLICATION NO.  : 13/234541
DATED            : August 13, 2013
INVENTOR(S)      : Jonathan Ronald Francis Strode It is certified that error appears in the above-identified patent and that said Letters Patent is hereby corrected as shown below:

In the Drawings:

Sheet 1 of 6, Fig. 1A    Delete "Analog Inout" and insert --Analog Input--

In the Specifications:

Column 1, Line 26    Delete "circuit (S/H)" and insert --(S/H) circuit--

Column 1, Line 27    Delete "(DAC) converter" and insert --converter (DAC)--

Signed and Sealed this
Fourth Day of February, 2014

Michelle K. Lee
*Deputy Director of the United States Patent and Trademark Office*